United States Patent
Yoon et al.

(10) Patent No.: US 7,375,003 B2
(45) Date of Patent: May 20, 2008

(54) METHODS OF MANUFACTURING A SEMICONDUCTOR DEVICE

(75) Inventors: Joo-Byoung Yoon, Yongin-si (KR);
Jin-Sung Kim, Suwon-si (KR);
Kyung-Woo Lee, Suwon-si (KR);
Yeong-Cheol Lee, Seoul (KR);
Sang-Jun Park, Suwon-si (KR);
Hwan-Shik Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 258 days.

(21) Appl. No.: 11/240,048

(22) Filed: Sep. 30, 2005

(65) Prior Publication Data

US 2006/0073691 A1    Apr. 6, 2006

(30) Foreign Application Priority Data

Oct. 4, 2004    (KR) ...................... 10-2004-0078597

(51) Int. Cl.
*H01L 21/20* (2006.01)

(52) U.S. Cl. .................................... 438/398

(58) Field of Classification Search ................ 257/534, 257/309; 438/381, 398, 386, 387, 396
See application file for complete search history.

(56) References Cited

U.S. PATENT DOCUMENTS

| 5,877,052 | A | 3/1999 | Lin et al. ..................... 438/238 |
| 6,194,281 | B1* | 2/2001 | Kang et al. .................. 438/398 |
| 6,946,356 | B2* | 9/2005 | Shin et al. ................... 438/381 |
| 2004/0043577 | A1 | 3/2004 | Hill ............................ 438/396 |

FOREIGN PATENT DOCUMENTS

| KR | 1996-0019709 | 6/1996 |
| KR | 10-0252211 | 1/2000 |

* cited by examiner

*Primary Examiner*—David A Zarneke
*Assistant Examiner*—Jenny L Wagner
(74) *Attorney, Agent, or Firm*—F. Chau & Associates, LLC.

(57) ABSTRACT

In a method of manufacturing a semiconductor device including a capacitor, a first mold layer is formed on a semiconductor substrate. The first mold layer is partially etched to form a first mold layer pattern including an opening for a capacitor. A first lower electrode layer is formed on the first mold layer pattern. A second lower electrode layer including a plurality of first pores is formed on the first lower electrode layer and in the opening. Upper portions of the first lower electrode layer and the second lower electrode layer are removed to form a first lower electrode and a second lower electrode in the opening. A dielectric layer and an upper electrode are successively formed on the first lower electrode and the second lower electrode. Therefore, a capacitor having an enhanced capacitance may be obtained.

19 Claims, 13 Drawing Sheets

METHODS OF MANUFACTURING A SEMICONDUCTOR DEVICE

CROSS REFERENCE TO RELATED APPLICATIONS

This application claims priority under 35 USC § 119 to Korean Patent Application No. 2004-78597 filed on Oct. 4, 2004, the contents of which are herein incorporated by reference in its entirety.

BACKGROUND OF THE INVENTION

1. Field of the Invention

The present invention relates to methods of manufacturing a semiconductor device. More particularly, the present invention relates to methods of manufacturing a semiconductor device including a capacitor.

2. Description of the Related Art

As a result of the demand for semiconductor devices having a high integration degree, certain design alterations have been made in producing semiconductor devices. Namely, in response to the above demand, the sizes of semiconductor devices have been rapidly decreased and also the unit cells of the semiconductor devices have been reduced in area. Typically, a semiconductor device such as DRAM requires a capacitor having a large capacitance to ensure an operational stability of the semiconductor device. However, as the unit cell of the semiconductor device is reduced in area, an increase of the capacitance may be limited.

The capacitance (C) of the capacitor is generally calculated as follow:

$$C = \epsilon \epsilon_0 \times A/d$$

wherein $\epsilon$ denotes a dielectric constant of a dielectric layer, $\epsilon_0$ denotes a vacuum permittivity, A denotes an effective area of the capacitor, and d denotes a thickness of the dielectric layer.

As can be gleaned from the above formula, methods of augmenting the dielectric constant of the dielectric layer, augmenting the effective area of the capacitor, and reducing the thickness of the dielectric layer are may all be utilized for enhancing the capacitance of the capacitor.

However, a decrease of the thickness of the dielectric layer has some limitations. For example, when the thickness of the dielectric layer is excessively reduced, leakage current through the dielectric layer increases and reliability of a semiconductor device including the dielectric layer may also be deteriorated. Thus, a method for enhancing the capacitance of a capacitor which involves decreasing the thickness of a dielectric layer may result in certain physical or economical limitations, such as those set forth above.

A high dielectric constant material that can be employed for the dielectric layer of the capacitor has been developed. The high dielectric constant material includes a metal oxide such as tantalum oxide, tantalum oxinitride, aluminum oxide, hafnium oxide, titanium oxide, etc. However, when using the high dielectric constant material for manufacturing the capacitor, a new process and a new material are also required. Although the new process is a developed one, it may be difficult to ensure the stability and reliability of this manufacturing process.

Accordingly, the method for enhancing the effective area of a capacitor may be more desirable than the other methods described above for enhancing the capacitance of a capacitor, when considering the above noted limitations associated with these other methods such as deterioration of the semiconductor device, leakage current generation, or the risks for applying the new material to a manufacturing process.

The capacitor has a plane structure in the early stage. When enhancing the effective area of a capacitor, capacitors having a stack structure or a trench structure have been used, and more recently capacitors having a cylindrical shape or a fin shape have been developed. Further, a hemi-spherical grain (HSG) is formed on an inside, an outside, or an inner and outer surface of a lower electrode having the cylindrical shape to thereby enhance capacitance of the capacitor. For example, U.S. Pat. No. 5,877,052 issued to Lin et al. discloses a method of manufacturing a capacitor having an enhanced capacitance, obtained using a storage electrode having an HSG thereon.

However, when the HSG is formed on a surface of a cylindrically shaped lower electrode, a dielectric layer is not uniformly formed on a dielectric layer. For example, the dielectric layer is not formed on a weak portion in the cylinder. The cylindrically shaped lower electrode including the HSG thereon has an effective area that is increased at most by about 10 to about 30% compared with that of a cylindrically shaped lower electrode without the HSG.

Korean Patent No. 252,211 discloses a method of manufacturing a cylindrical-type capacitor having an enhanced capacitance. In the method, an ozone tetraethylorthosilicate undoped silicate glass (TEOS-USG) layer pattern including a pore is formed, and a conductive layer is formed on the ozone TEOS-USG layer pattern to thereby form a lower electrode. However, the pore of the ozone TEOS-USG layer is formed by using a polysilicon layer as a lower layer of the ozone TEOS-USG layer pattern. The dimension of the pore may not be controlled, and also reproducibility of the pore may not be ensured. Further, an etching process is employed for increasing the dimension of the pore. An entire surface of the ozone TEOS-USG layer pattern may be etched in the etching process, and thus the ozone TEOS-USG layer pattern may not have a desired shape. Therefore, the lower electrode may not be uniformly formed on the ozone TEOS-USG layer pattern.

SUMMARY OF THE INVENTION

Example embodiments of the present invention provide a method of manufacturing a semiconductor device including a capacitor having an enhanced capacitance.

In an example embodiment of the present invention, there is provided a method of manufacturing a semiconductor device. In the method, a first mold layer is formed on a substrate. The first mold layer is partially etched to form a first mold layer pattern having an opening for a capacitor. A first lower electrode layer is formed on the first mold layer pattern. A second lower electrode layer having a plurality of first pores is formed in the opening and on the first lower electrode layer. The first lower electrode layer and the second lower electrode layer are partially removed to form a first lower electrode and a second lower electrode in the opening, respectively. A dielectric layer and an upper electrode are successively formed on the first lower electrode and the second lower electrode.

In another example embodiment of the present invention, there is provided a method of manufacturing a semiconductor device. In the method, a first insulation interlayer having a contact is formed on a substrate. A first mold layer pattern is formed on the first insulation interlayer. The first mold layer pattern has an opening that exposes an upper surface of the contact. A first lower electrode layer is formed on a surface of the first mold layer pattern. A preliminary second mold layer surrounding a micelle is formed in the opening and on the first lower electrode layer. The micelle is removed to form a second mold layer having a plurality of first pores. A second lower electrode layer is formed to fill up the first pore. The first lower electrode layer and the second lower electrode layer are partially removed to form a first lower electrode and a second lower electrode, respectively. The first mold layer pattern and the second mold layer are selectively removed. A dielectric layer and an upper electrode are successively formed on the first lower electrode and the second lower electrode.

According to the present invention, a capacitor including a first lower electrode and a second lower electrode may be manufactured. The first lower electrode has a cylindrical structure. The second lower electrode having a plurality of pores is formed in the cylindrical structure, and the second lower electrode has a stable structure that is connected to the first lower electrode. The capacitor may have an enhanced effective area, and thus the capacitor having an enhanced capacitance may be manufactured.

BRIEF DESCRIPTION OF THE DRAWINGS

The above and other features and advantages of the present invention will become more apparent by describing example embodiments thereof with reference to the accompanying drawings, in which.

DESCRIPTION OF THE EMBODIMENTS

Figure 1:
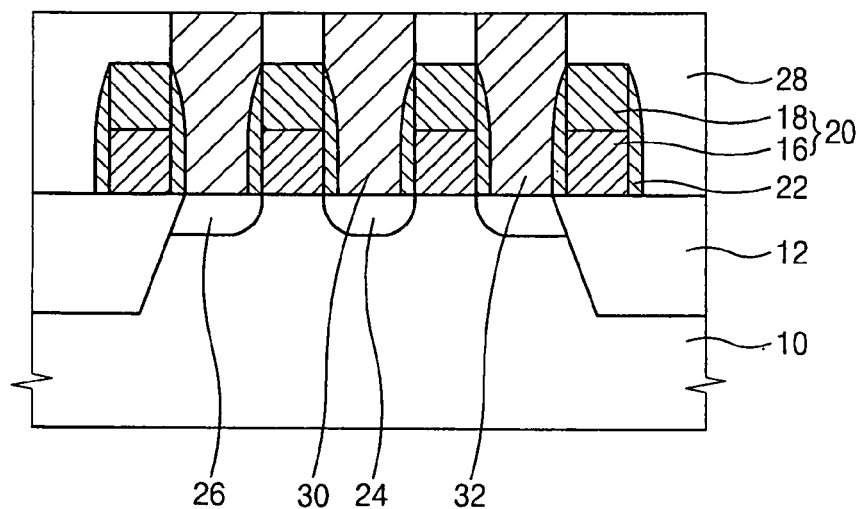
FIGS. 1 to 13 are cross-sectional views illustrating a method of manufacturing a DRAM device in accordance with an example embodiment of the present invention.

The example embodiments of the present invention are described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized example embodiments (and intermediate structures) of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 13 are cross-sectional views illustrating a method of manufacturing a DRAM device in accordance with an example embodiment of the present invention.

FIG. 1 is a cross-sectional view illustrating formation of gate structures 20, first pads 30 and second pads 32.

Referring to FIG. 1, an isolation layer 12 is formed at an upper portion of the semiconductor substrate 10 to define an active region and a field region. The isolation layer 12 may be formed by a shallow trench isolation (STI) process or a local oxidation of silicon (LOCOS) process. A gate oxide layer (not shown) is formed on the active region of the semiconductor substrate 10. The gate oxide layer may be formed by a thermal oxidation process or a chemical vapor deposition (CVD) process.

A gate conductive layer and a first hard mask layer are successively formed on the semiconductor substrate 10 on which the gate oxide layer is formed. The gate conductive layer and the first hard mask layer are patterned to form gate structures 20 having a gate conductive layer pattern 16 and a first hard mask pattern 18. A plurality of gate spacers 22 is formed on sidewalls of the gate structures 20. For example, the gate spacers 22 are formed using a nitride such as silicon nitride.

Using an ion implantation process, impurities are implanted into the semiconductor substrate 10 that is exposed between the gate structures 20 to form source/drain regions 24 and 26. The gate structures 20 are used as masks in the ion implantation process. Through successive processes, the source region 24 is electrically connected to a bit line and the drain region 26 is electrically connected to a capacitor.

The first insulation interlayer 28 is formed on the semiconductor substrate 10 to cover the gate structures 20. The first insulation interlayer 28 may be formed using an oxide such as silicon oxide. Examples of the oxide include borophosphor silicate glass (BPSG), phosphor silicate glass (PSG), undoped silicate glass (USG), spin-on glass (SOG), tetraethyl orthosilicate (TEOS), high density plasma-chemical vapor deposition (HDP-CVD) oxide, etc.

The first insulation interlayer 28 is partially etched to form first contact holes exposing the source/drain regions 24 and 26. The first contact holes are filled with a conductive material to form a first pad 30 and a second pad 32. The first pad 30 is connected to a bit line, and the second pad 32 is connected to a capacitor through successive processes.

Figure 2:
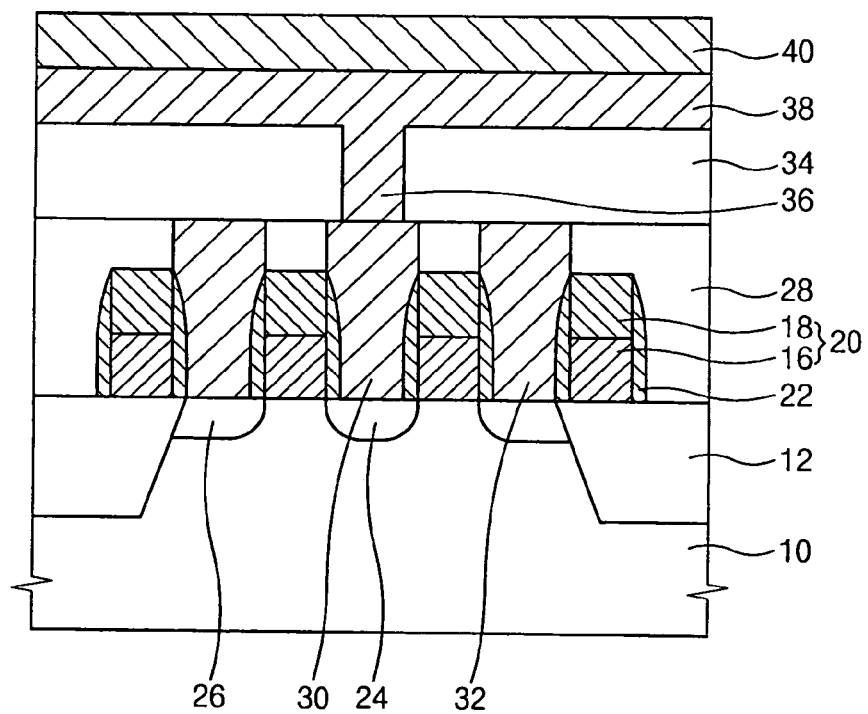

FIG. 2 is a cross-sectional view illustrating formation of a bit line 38 and a second hard mask pattern 40.

Referring to FIG. 2, a second insulation interlayer 34 is formed on the first insulation interlayer 28 in which the first pad 30 and the second pad 32 are formed. The second insulation interlayer 34 is partially etched to form a second contact hole exposing an upper surface of the first pad 30.

A first conductive layer for a bit line is formed on the second insulation interlayer 34 to fill up the second contact hole. The first conductive layer may be formed using a conductive material such as doped polysilicon or a metal. A second hard mask pattern 40 for forming a bit line is formed on the first conductive layer. The first conductive layer is patterned using the second hard mask pattern 40 as a mask to form a bit line contact 36 and a bit line 38.

Bit line spacers (not shown) are formed on sidewalls of a bit line structure including the bit line 38 and the second hard mask pattern 40. The bit line spacers may be formed using a nitride such as silicon nitride.

Figure 3:
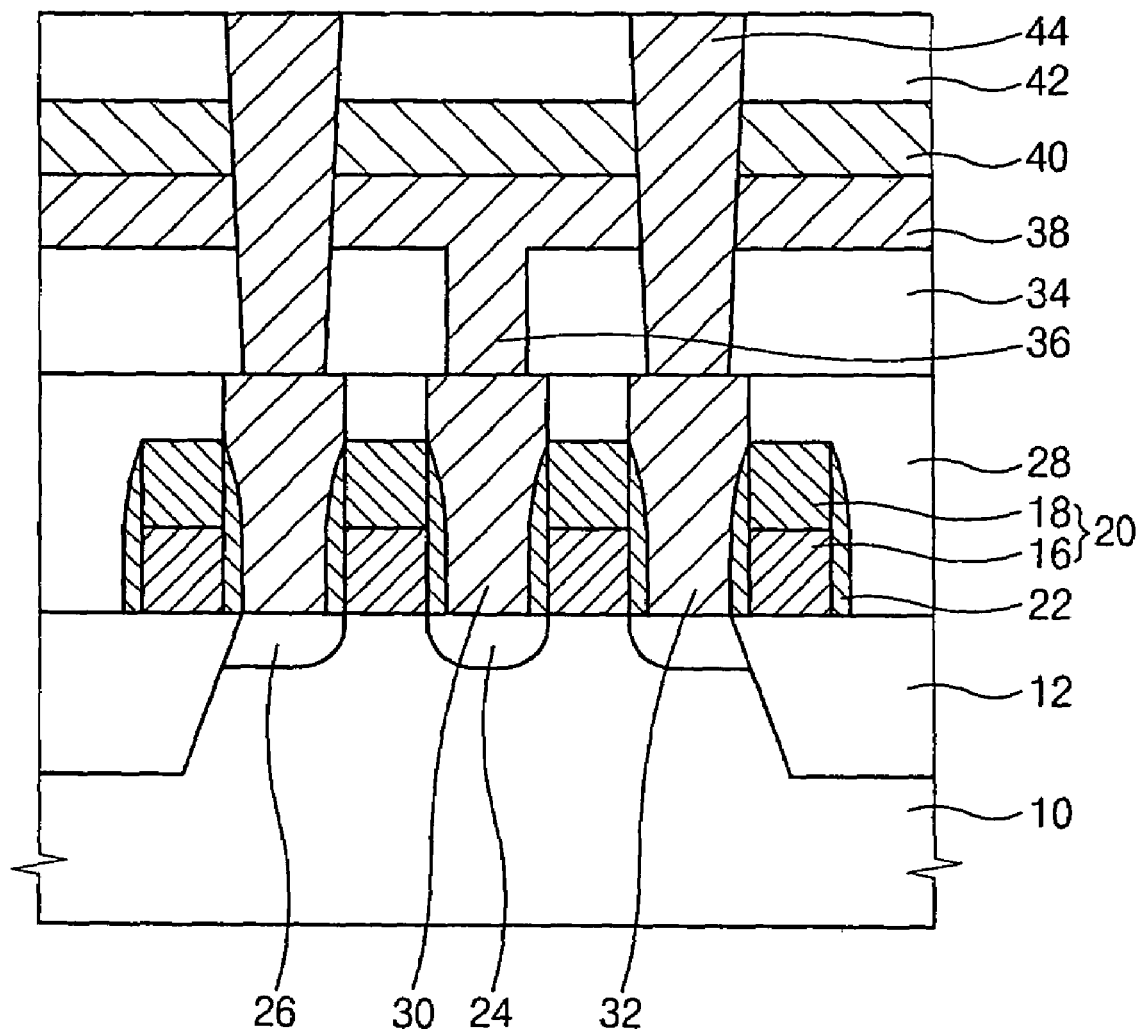

FIG. 3 is a cross-sectional view illustrating formation of a contact 44.

Referring to FIG. 3, a third insulation interlayer 42 is formed on the second insulation interlayer 34 to cover the bit line 38 and the second hard mask pattern 40. The third insulation interlayer 42 is partially etched to form third contact holes exposing the second pad 32. The etching process may be performed so that the third contact holes are self-aligned relative to the bit line structure including the bit line 38 and the second hard mask pattern 40. The third contact holes are filled with a conductive material to form a contact 44 for a lower electrode.

Figure 4:
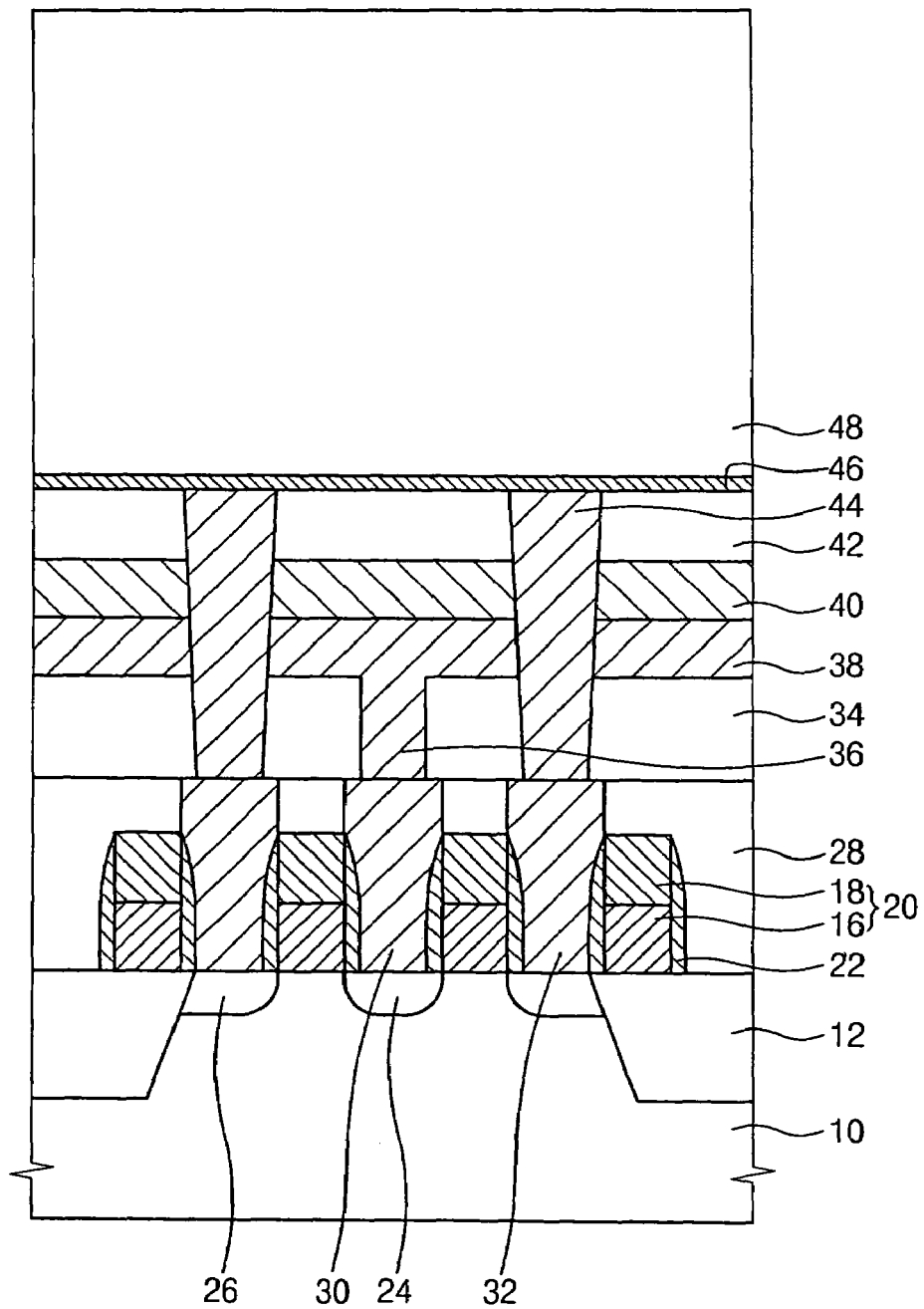

FIG. 4 is a cross-sectional view illustrating formation of an etch stop layer 46 and a first mold layer 48.

Referring to FIG. 4, the etch stop layer 46 is formed on the third insulation interlayer 42 and the contact 44 for the lower electrode. The etch stop layer 46 may be formed using a material that has an etching selectivity relative to the first mold layer 48 and a second mold layer 58 (see FIG. 8). For example, the etch stop layer 46 may be formed using a nitride such as silicon nitride.

The first mold layer 48 is formed on the etch stop layer 46. The first mold layer 48 is provided for formation of a lower electrode or a storage electrode. For example, the first mold layer 48 is formed using an oxide such as TEOS, HDP-CVD oxide, plasma enhanced TEOS (PE-TEOS), PSG, USG, BPSG, SOG, etc. Preferably, the first mold layer 48 is formed using TEOS.

A thickness of the first mold layer 48 may be adjusted in accordance with a desired capacitance of a capacitor. That is, because a height of the capacitor is determined by the thickness of the first mold layer 48, the first mold layer 48 may have a thickness larger than a desired height of the capacitor. For example, the first mold layer 48 may have a thickness of about 5,000 to about 20,000 Å.

Figure 5:
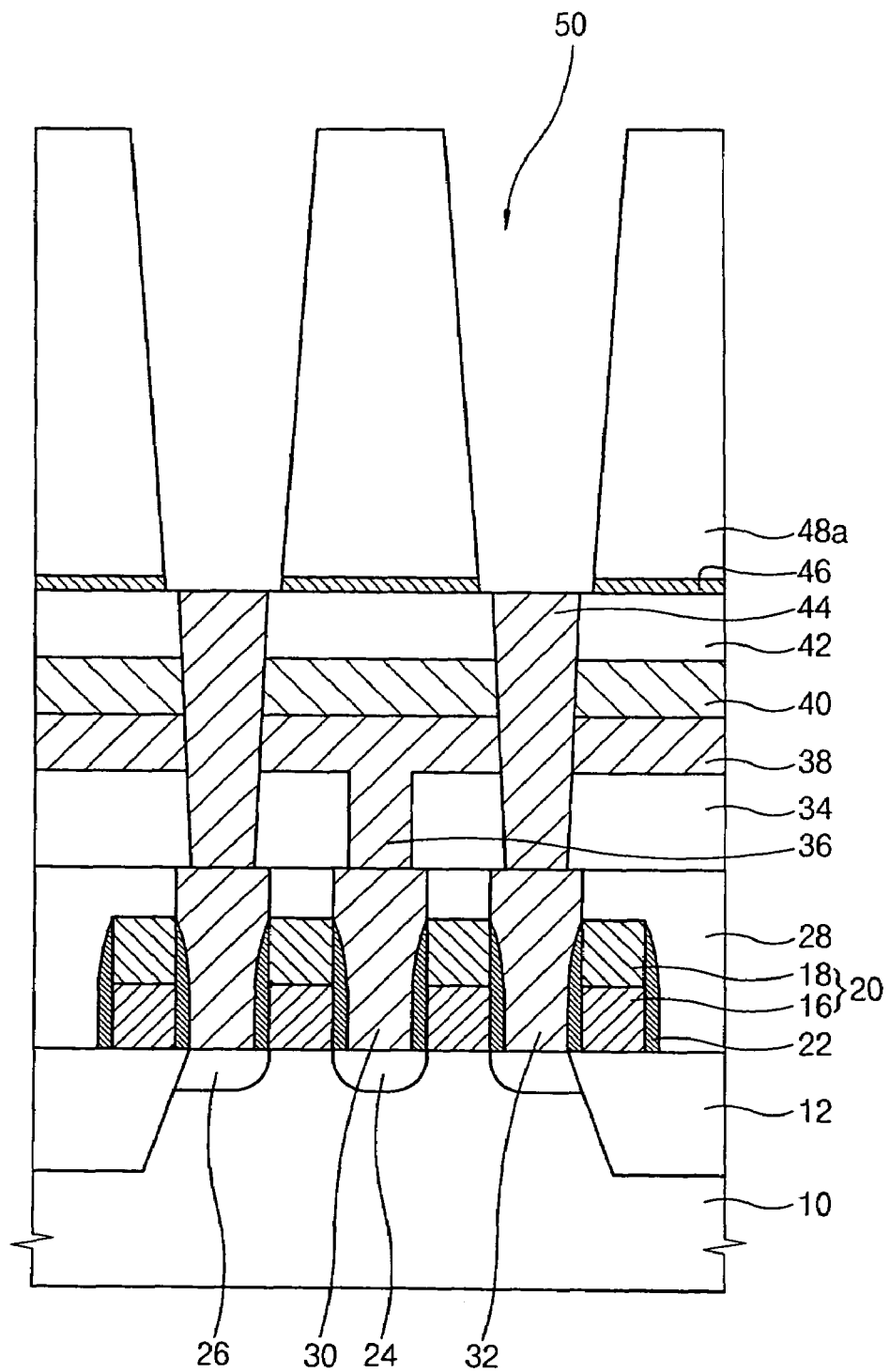

FIG. 5 is a cross-sectional view illustrating formation of an opening 50.

Referring to FIG. 5, a photoresist pattern (not shown) is formed on the first mold layer 48. The first mold layer 48 is partially etched using the photoresist pattern as a mask to form a first mold layer pattern 48a. After etching the first mold layer 48, the etch stop layer 46 that is exposed between the first mold layer patterns 48a is etched to form an opening 50 that exposes an upper surface of the contact 44. The photoresist pattern is removed by an ashing and/or a stripping process.

Alternatively, a third hard mask pattern (not shown) is formed on the first mold layer 48, and then the first mold layer 48 is partially etched using the third hard mask pattern as a mask to form the opening 50. The third hard mask pattern may be formed using a material that has an etching selectivity relative to the first mold layer 48. For example, the third hard mask pattern may be formed using polysilicon. After formation of the opening 50, removing the third hard mask pattern may be optionally performed.

The opening 50 serves as a mold for forming a lower electrode having a cylinder shape.

Figure 6:
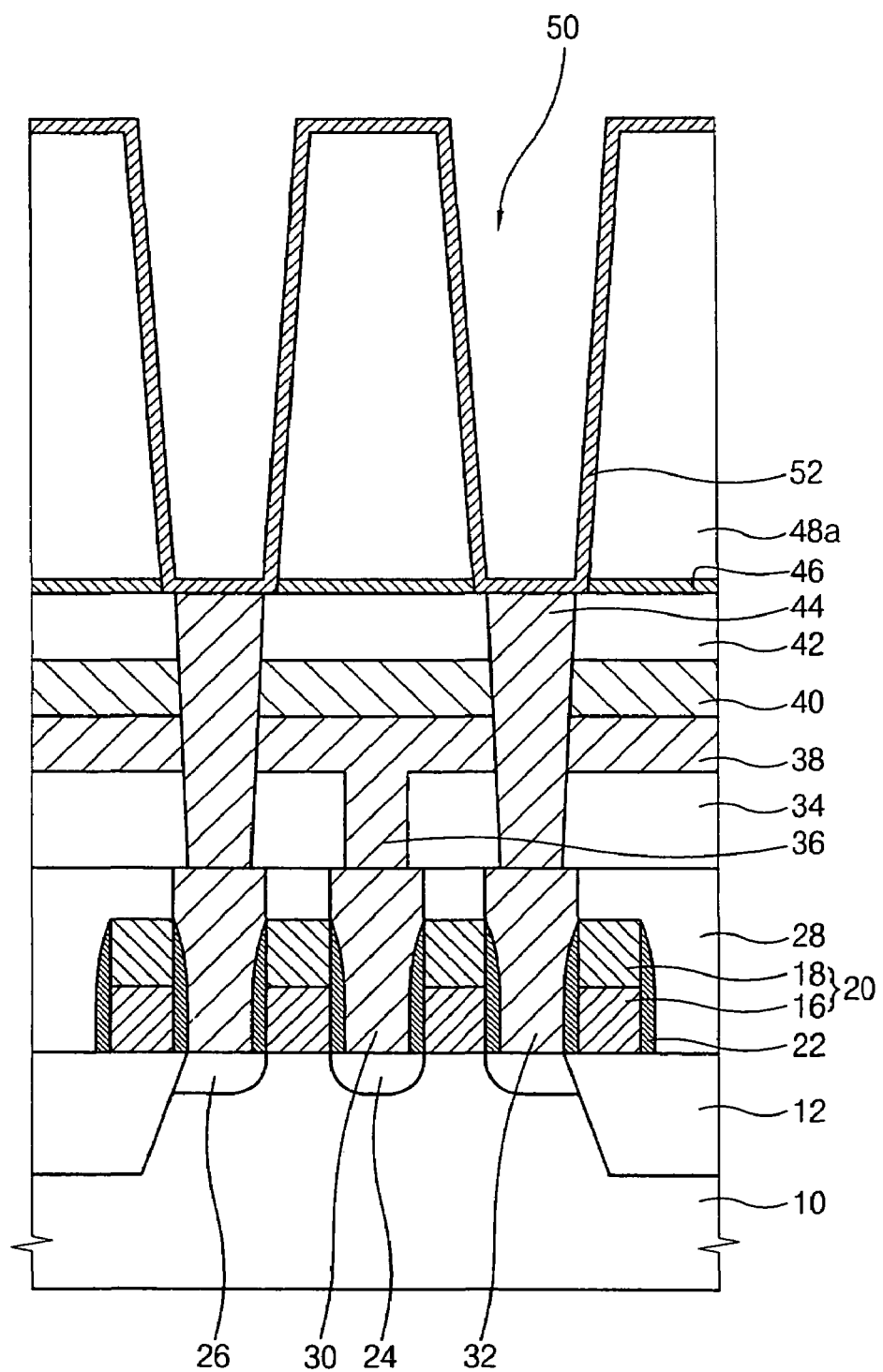

FIG. 6 is a cross-sectional view illustrating formation of a first lower electrode layer 52.

Referring to FIG. 6, a first lower electrode layer 52 is formed on an inner surface of the opening 50 and an upper surface of the first mold layer pattern 48a. The first lower electrode layer 52 may be formed using a conductive material such as a metal, a conductive metal nitride or doped polysilicon. Examples of the metal and the metal nitride include platinum (Pt), iridium (Ir), tantalum (Ta), titanium (Ti), iron (Fe), platinum nitride, iridium nitride, tantalum nitride, titanium nitride, titanium aluminum nitride and iron nitride.

The first lower electrode layer 52 has a uniform thickness not to fill up the opening 50 completely. The first lower electrode layer 52 may be formed using a process having an enhanced characteristic for step coverage. Thus, the first lower electrode layer 52 may be formed using a chemical vapor deposition (CVD) process or an atomic layer deposition (ALD) process.

Figure 7:
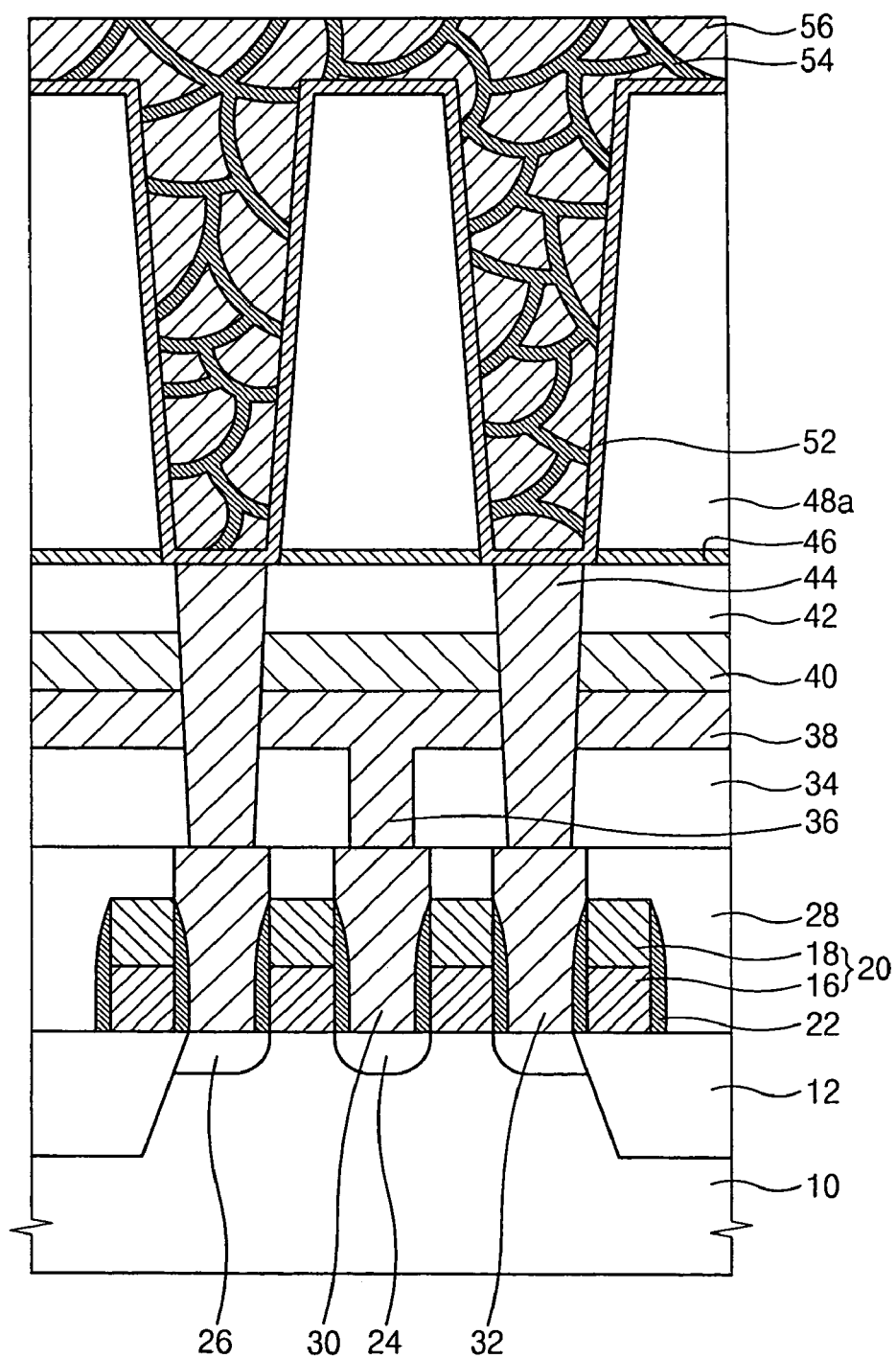

FIG. 7 is a cross-sectional view illustrating formation of a micelle 54.

Referring to FIG. 7, a combination of a surfactant and pure water is introduced into the opening 50 and on the first mold layer pattern 48a. A micelle 54 is formed in the opening 50 and on the first mold layer pattern 48a. The micelle 54 is surrounded by pure water 56.

The micelle 54 is a self-assembly of the surfactant in the combination of the surfactant and the pure water 56. Hydrophilic portions of the surfactant are exposed to pure water and hydrophobic portions of the surfactant are oriented to the inside of the micelle 54.

A structure of the micelle 54 may be changed in accordance with a concentration of the surfactant in the combination of the surfactant and the pure water 56. For example, the micelle 54 has a spherical structure, a lamellar structure, a hexagonal structure or a tetragonal structure according to the concentration of the surfactant.

When the concentration of the surfactant is relatively low, the micelle 54 has the spherical structure. As the concentration of the surfactant increases, the micelle 54 having the spherical structure may be self-assembled to form various self-assemblies such as the lamellar structure, the hexagonal structure, the tetragonal structure, etc.

In accordance with an example embodiment of the present invention, the micelle 54 having the tetragonal structure is advantageously formed. When the micelle 54 has the spherical structure, the lamellar structure or the hexagonal structure, the micelle 54 is located within the second mold layer 58 (see FIG. 8) in a successive process, and thus removing the micelle 54 may be difficult. Although the micelle 54 is removed, forming a dielectric layer in vacant space that is formed by removal of the micelle 54 may be difficult. However, because channels of the tetragonal structure are interconnected with each other, the micelle 54 may be easily removed after formation of a second mold layer 58 (see FIG. 8), and a dielectric layer 64 (see FIG. 13) may be uniformly formed on the second mold layer 58.

The surfactant that can form the micelle 54 in a combination of the surfactant and pure water may be used. For example, the micelle is formed using an amine compound, an ammonium compound, an amphiphilic block copolymer, etc.

Examples of the amine compound may include octyl amine, decyl amine, dodecyl amine, tetradecylamine, hexadecylamine, octadecylamine, etc. These can be used alone or in a mixture thereof.

Examples of the ammonium compound may include octyltrimethylammonium bromide, octyltrimethylammonium chloride, decyltrimethylammonium bromide, decyltrimethylammonium chloride, dodecyltrimethylammonium bromide, dodecyltrimethylammonium chloride, trimethyltetradecylammonium bromide, trimethyltetradecylammonium chloride, cetyltrimethylammonium bromide, cetyltrimethylammonium chloride, octadecylammonium bromide, octadecylammonium chloride, etc. These can be used alone or in a mixture thereof.

An example of the amphiphilic block copolymer may include poly(ethylene oxide)-poly(propylene oxide)-poly(ethylene oxide) (PEO-PPO-PEO).

In case that the micelle 54 is a self-assembly of the surfactant in a combination of the surfactant and pure water, a dimension of the micelle 54 may vary in accordance with a chain length of the surfactant. The dimension of the micelle 54 means a cross-sectional dimension of the micelle 54. When the chain length of the surfactant is relatively small, the dimension of the micelle 54 may be small. When the chain length of the surfactant is relatively large, the dimension of the micelle 54 may be large. Therefore, the dimension of the micelle 54 may be easily adjusted by changing the chain length of the surfactant.

When the dimension of the micelle 54 is large, a pore dimension of a second mold layer 58 (see FIG. 8) may be large. The pore dimension of the second mold layer 58 may be controlled by changing the dimension of the micelle 54. The micelle 54 has a desirable dimension in a range of about 2 to about 100 nm. When the dimension of the micelle 54 is less than about 2 nm, the pore dimension of the second mold layer 58 may be too small such that forming the dielectric layer 64 (see FIG. 13) and an upper electrode 66 (see FIG. 13) on a surface of the second mold layer 58 may be difficult. When the dimension of the micelle 54 is greater than about 100 nm, the pore dimension of the second mold layer 58 may be too large such that a surface area of a second lower electrode 62a (see FIG. 11) may not be sufficiently enhanced.

Figure 8:
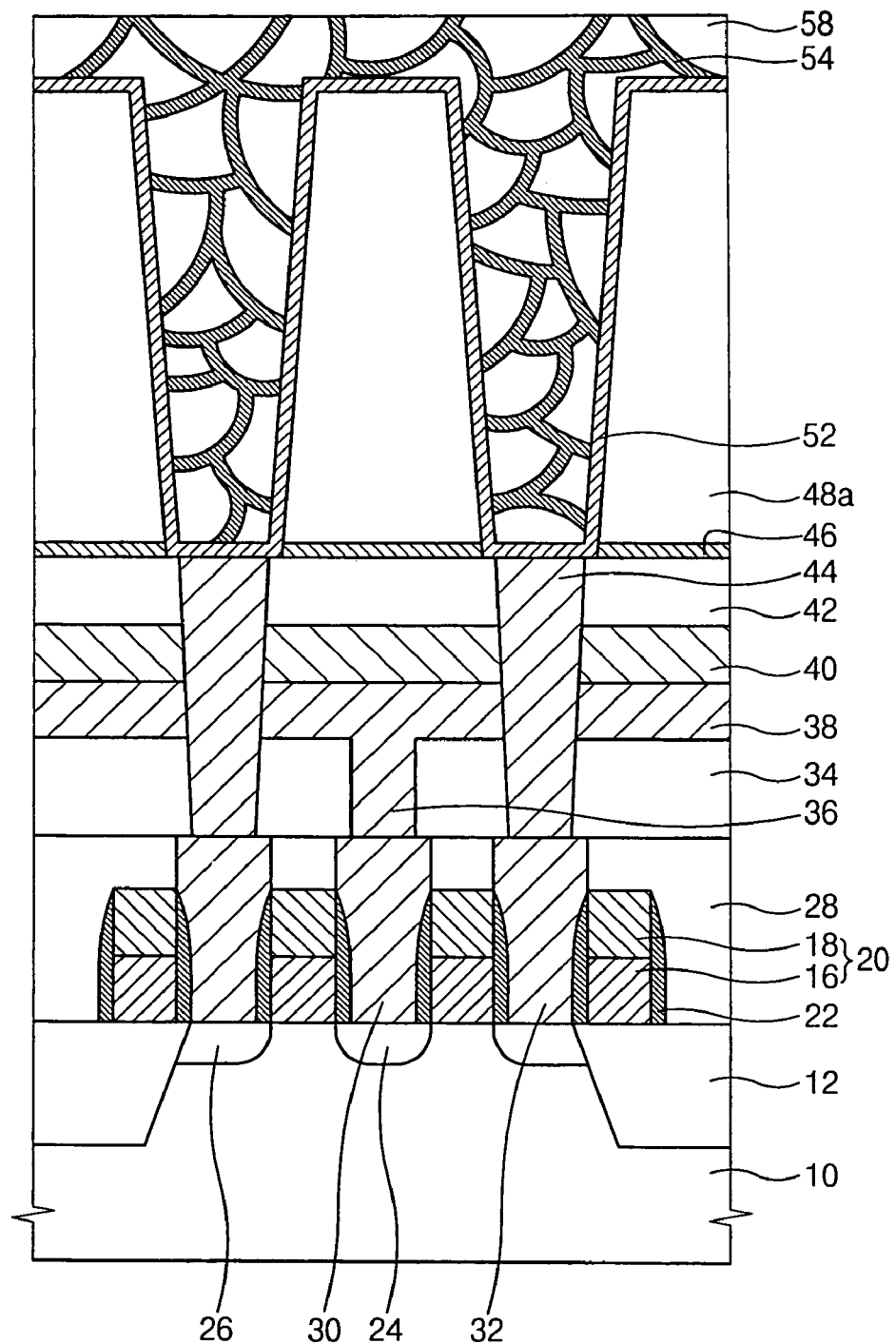

FIG. 8 is a cross-sectional view illustrating formation of the second mold layer 58.

Referring to FIG. 8, the second mold layer 58 is formed to surround the micelle 54. The opening 50 is completely filled with the second mold layer 58 and the micelle 54. Preferably, the second mold layer 58 may be formed by converting pure water 56 surrounding the micelle 54 into a solid material. Before the micelle 54 is removed to form a pore in the second mold layer 58, the second mold layer 58 may be referred to as a preliminary second mold layer. The preliminary second mold layer may be formed in the opening 50 and on the first lower electrode layer 52 to surround the micelle 54.

The second mold layer 58 is formed using an oxide such as silicon oxide or transition metal oxide. Examples of the transition metal oxide may include titanium oxide, zirconium oxide, niobium oxide, etc.

The second mold layer 58 may be formed using a silicon oxide source such as tetraalkyl orthosilicate, fumed silica, sodium silicate or spin-on-glass (SOG). Examples of the tetraalkyl orthosilicate may include tetramethyl orthosilicate (TMOS), tetraethyl orthosilicate (TEOS), tetrapropyl orthosilicate (TPOS), etc. These can be used alone or in a mixture thereof.

Hereinafter, forming the second mold layer 58 using TEOS will be described. The TEOS that exists in a liquid phase or a vapor phase is introduced into the opening 50. The TEOS may be adsorbed to pure water 56 to form silicon oxide that exists in a solid phase. Thus, when TEOS is introduced into the opening 50, silicon oxide is formed in a region that is occupied by the pure water 56 in the opening 50 to form the second mold layer 58.

A structure of the second mold layer 58 surrounding the micelle 54 may be changed in accordance with a molar ratio (or a weight ratio) of the surfactant, the TEOS and the water. When forming the second mold layer 58 that surrounds the micelle 54 having a tetragonal structure, the molar ratio of the surfactant, the TEOS and the water may be adjusted properly.

Figure 14:
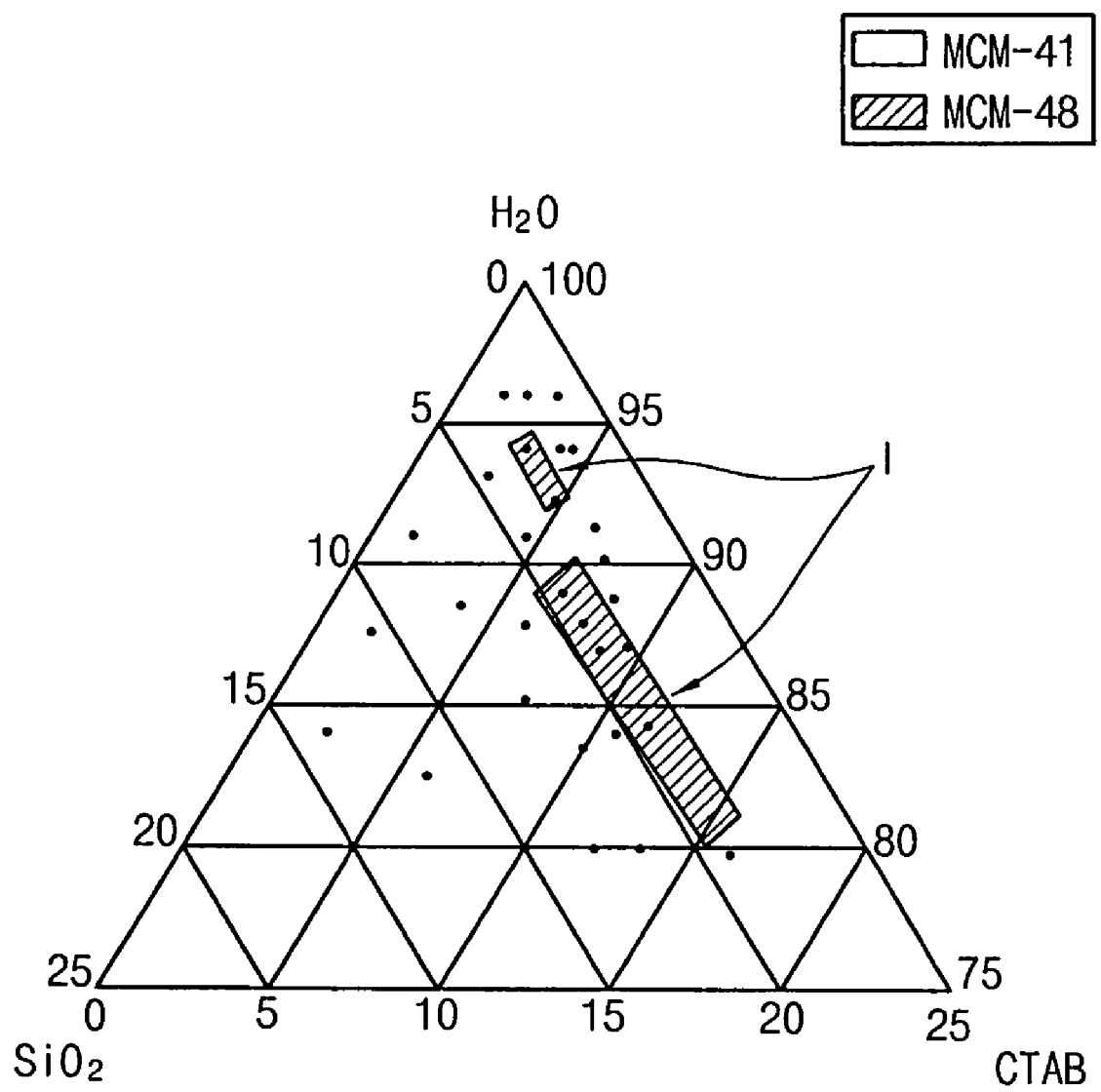
FIG. 14 is a phase diagram of a combination of cetyltrimethylammonium bromide (CTAB), tetraethyl orthosilicate (TEOS) and water.

FIG. 14 is a phase diagram of a combination of cetyltrimethylammonium bromide (CTAB), TEOS and water.

Referring to FIG. 14, when a weight ratio of CTAB, TEOS and water is in a range of "I" of the phase diagram, the combination of the CTAB, the TEOS and the water may form the micelle 54 having the tetragonal structure. When the weight ratio of the CTAB, the TEOS and the water is in a range of about 2-17: about 2-7: about 80-95, the combination of the CTAB, the TEOS and the water may form the tetragonal structure.

Preferably, the second mold layer 58 may be formed using a material that has an etching rate substantially identical to that of the first mold layer pattern 48a. In this case, the first mold layer pattern 48a and the second mold layer 58 may be removed by one process, thereby simplifying a manufacturing process.

Figure 9:
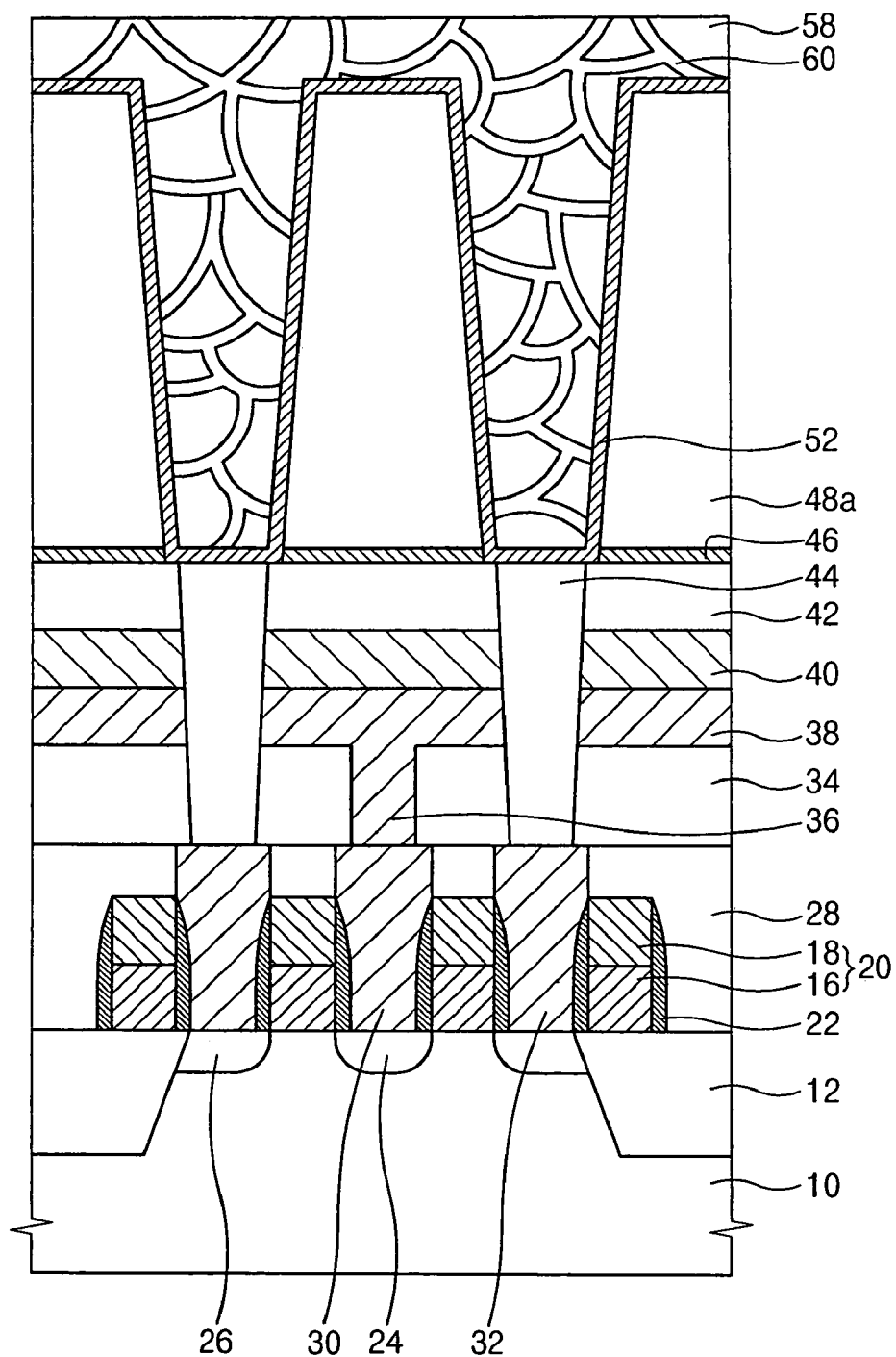

FIG. 9 is a cross-sectional view illustrating removal of the micelle 54.

Referring to FIG. 9, the micelle 54 is selectively removed from the second mold layer 58. The micelle 54 may be removed by a thermal combustion process, an extraction process and/or an ashing process. The extraction process may be performed using an organic solvent having a relatively high polarity. An example of the organic solvent may include tetrahydrofuran (THF). The thermal combustion process may be performed at a temperature of about 600° C.

When the micelle 54 is selectively removed, a plurality of the first pores 60 is formed in the second mold layer 58. Preferably, the first pore 60 may include a cross-sectional diameter in a range of about 2 to about 100 nm. When the micelle 54 includes the tetragonal structure, a plurality of the first pores 60 includes a three-dimensional network structure.

Figure 10:
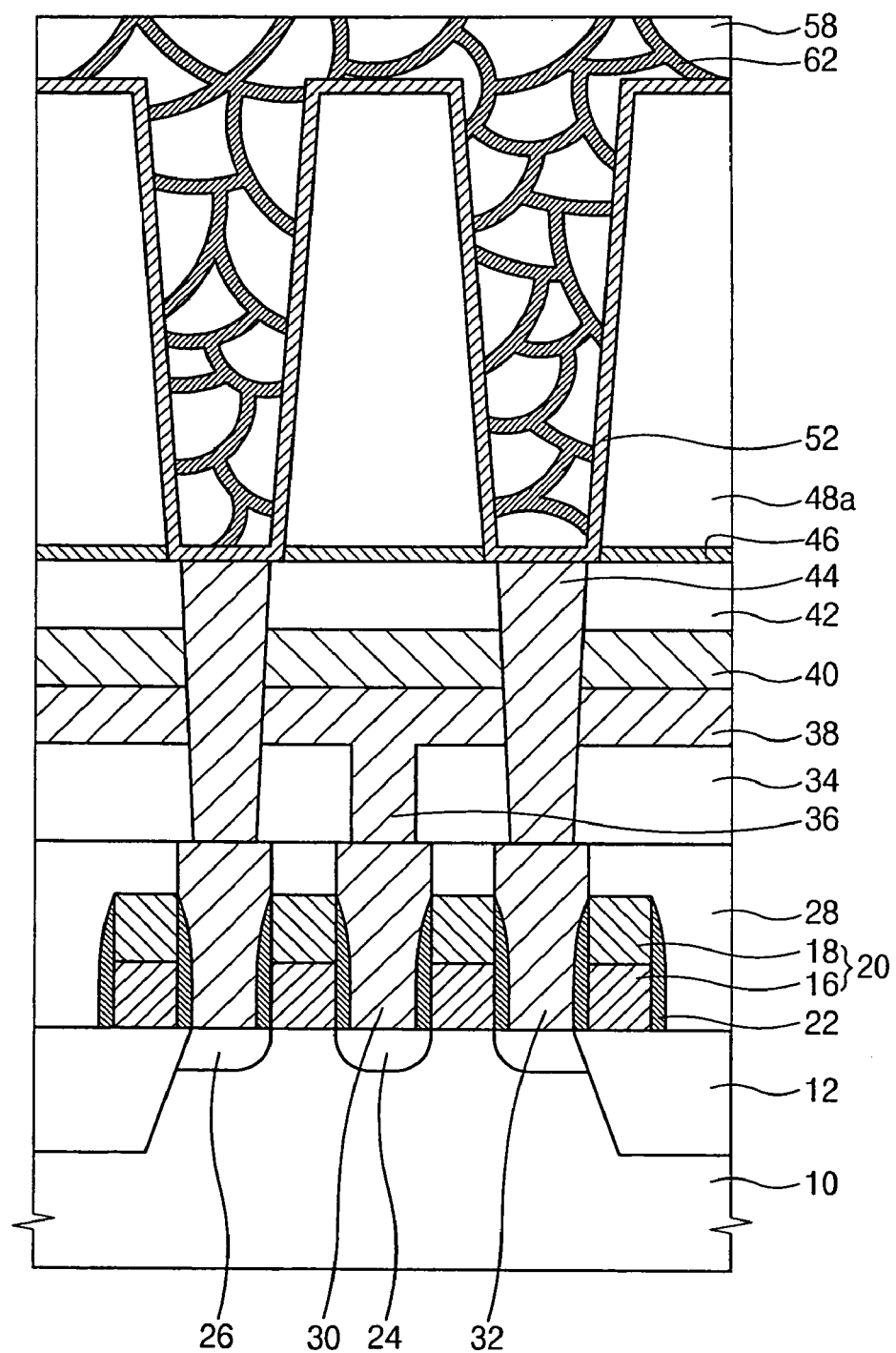

FIG. 10 is a cross-sectional view illustrating formation of a second lower electrode layer 62.

Referring to FIG. 10, the second lower electrode layer 62 is formed to fill the first pore 60 in the second mold layer 58. The second lower electrode layer 62 may be formed using a conductive material such as a metal, a conductive metal nitride or doped polysilicon. Examples of the metal may include platinum, iridium, tantalum, titanium, iron, etc. Examples of the conductive metal nitride may include platinum nitride, iridium nitride, tantalum nitride, titanium nitride, titanium aluminum nitride, iron nitride, etc. The second lower electrode layer 62 having a single or multi-layer structure may be formed using the conductive material.

To fill up the first pore 60 having a small pore dimension, the second lower electrode layer 62 may be formed using a process having an enhanced characteristic for step coverage. Thus, the second lower electrode layer 62 may be advantageously formed using a CVD process or an ALD process.

The second lower electrode layer 62 has a plurality of second pores. The second pore is filled with the second mold layer 58 before the second mold layer 58 is removed. When the micelle 54 includes the tetragonal structure, the second lower electrode layer 62 has a three-dimensional network structure of a fine conductive line, and the second lower electrode layer 62 is electrically connected to the first lower electrode layer 52.

Figure 11:
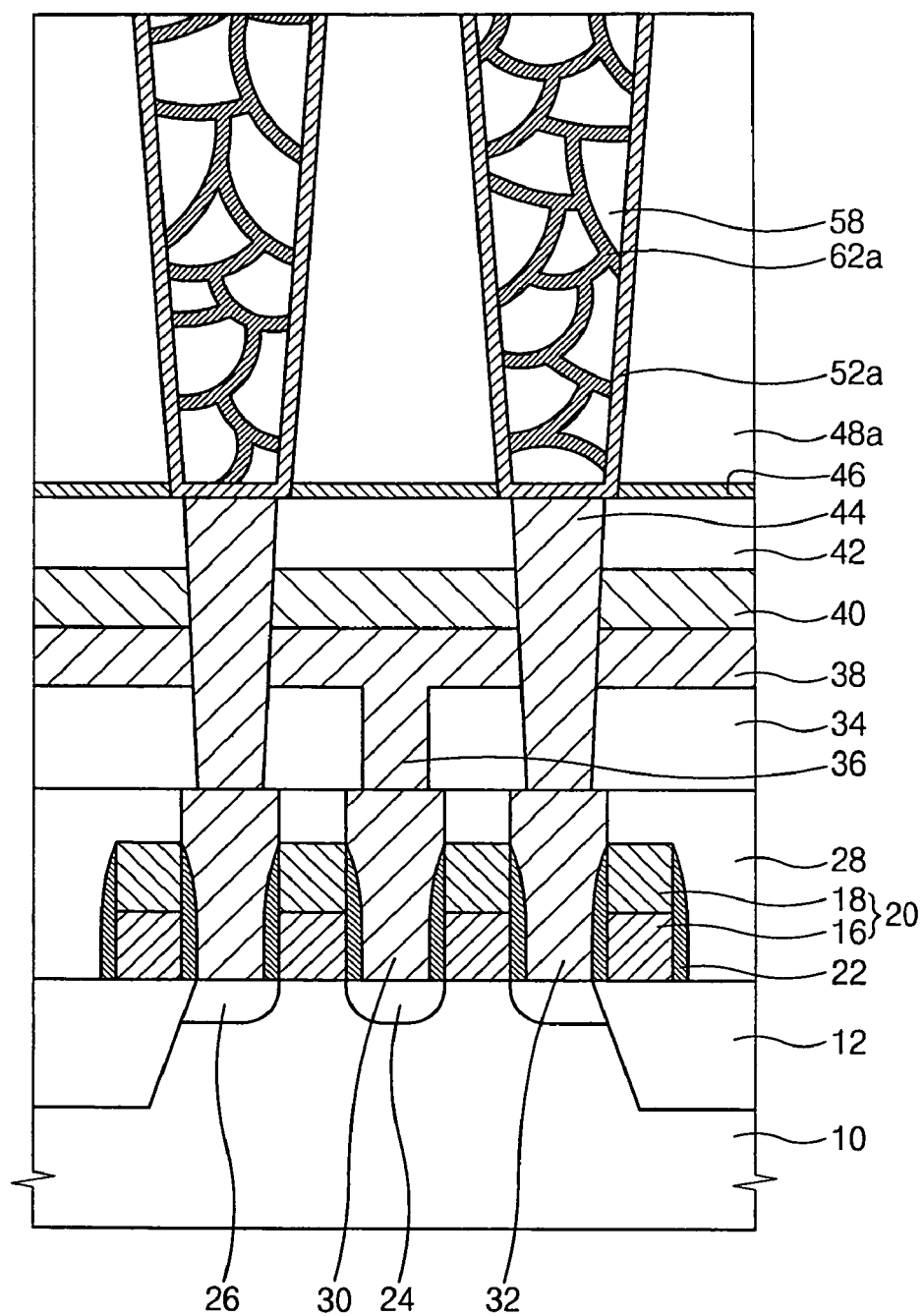

FIG. 11 is a cross-sectional view illustrating formation of a first lower electrode 52a and a second lower electrode 62a.

Referring to FIG. 11, the second mold layer 58, the second lower electrode layer 62 and the first lower electrode layer 52 are sequentially polished until the first mold layer pattern 48a is exposed. The first lower electrode 52a and the second lower electrode 62a are formed only in the opening 50 by removal of upper portions of the second lower electrode layer 62 and the first lower electrode layer 52. The first lower electrode 52a has a cylindrical shape. The second lower electrode 62a having a three-dimensional network structure is formed in the cylinder of the first lower electrode 52a. The second lower electrode 62a is electrically connected to the first lower electrode 52a.

Figure 12:
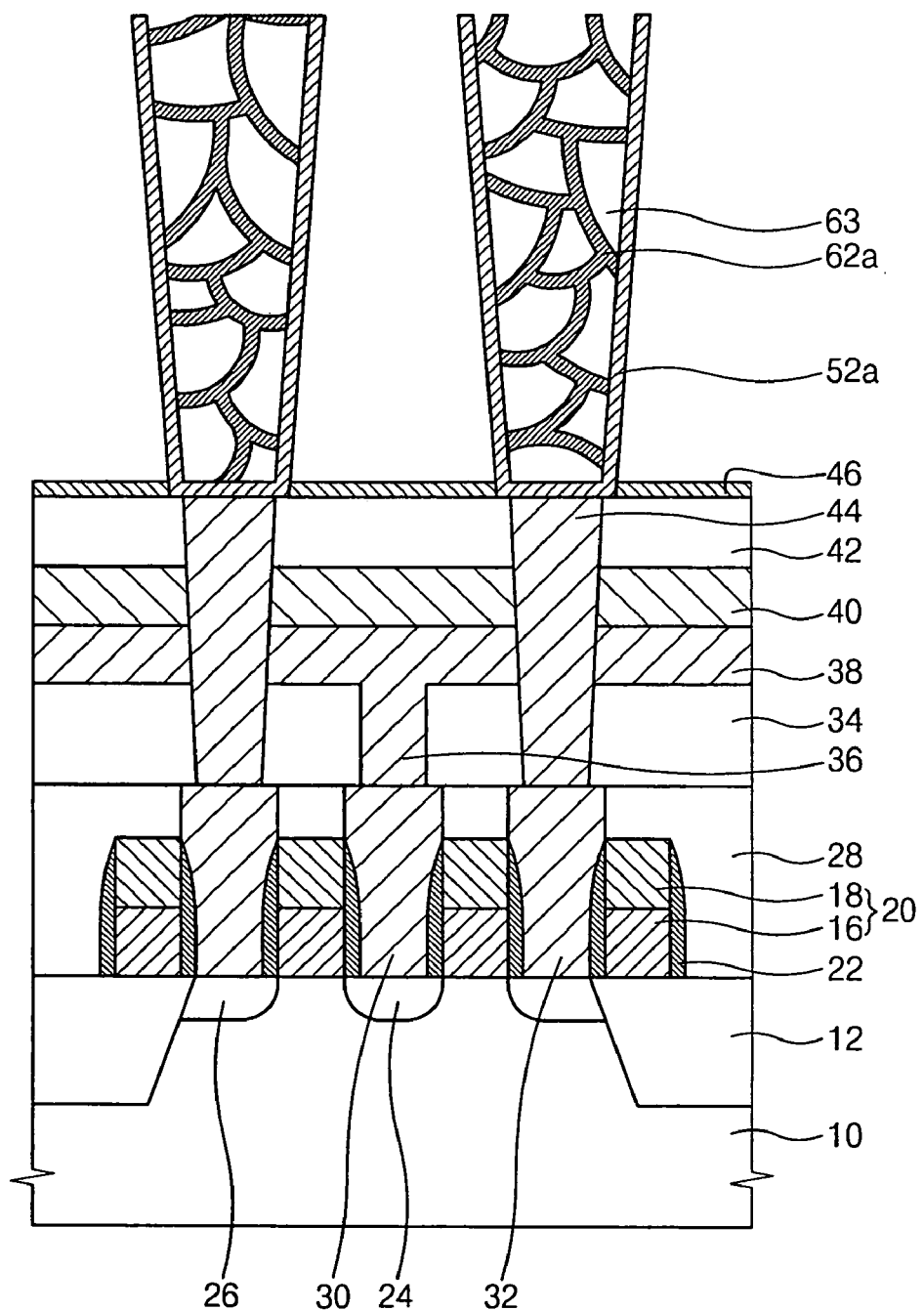

FIG. 12 is a cross-sectional view illustrating removal of the first mold layer pattern 48a and the second mold layer 58.

Referring to FIG. 12, the first mold layer pattern 48a and the second mold layer 58 are removed using an isotropic etching process. Examples of the isotropic etching process include a wet etching process and a chemical dry etching process.

When the first mold layer pattern 48a and the second mold layer 58 are formed using silicon oxide, the first mold layer pattern 48a and the second mold layer 58 may be removed with a similar etching rate by an etching agent that is used for etching silicon oxide. The first mold layer pattern 48a and the second mold layer 58 may be simultaneously removed in the wet etching process using the etching agent for silicon oxide. Examples of the etching agent may include a fluorine-containing solution, a solution including ammonium hydroxide, hydrogen peroxide and deionized water, an LAL solution including ammonium fluoride, hydrogen fluoride and distilled water, etc.

When the first mold layer pattern 48a and the second mold layer 58 are removed using the chemical dry etching process, an etching gas including hydrogen fluoride and water vapor, or an etching gas including tetrafluoromethane and oxygen may be used.

Figure 13:
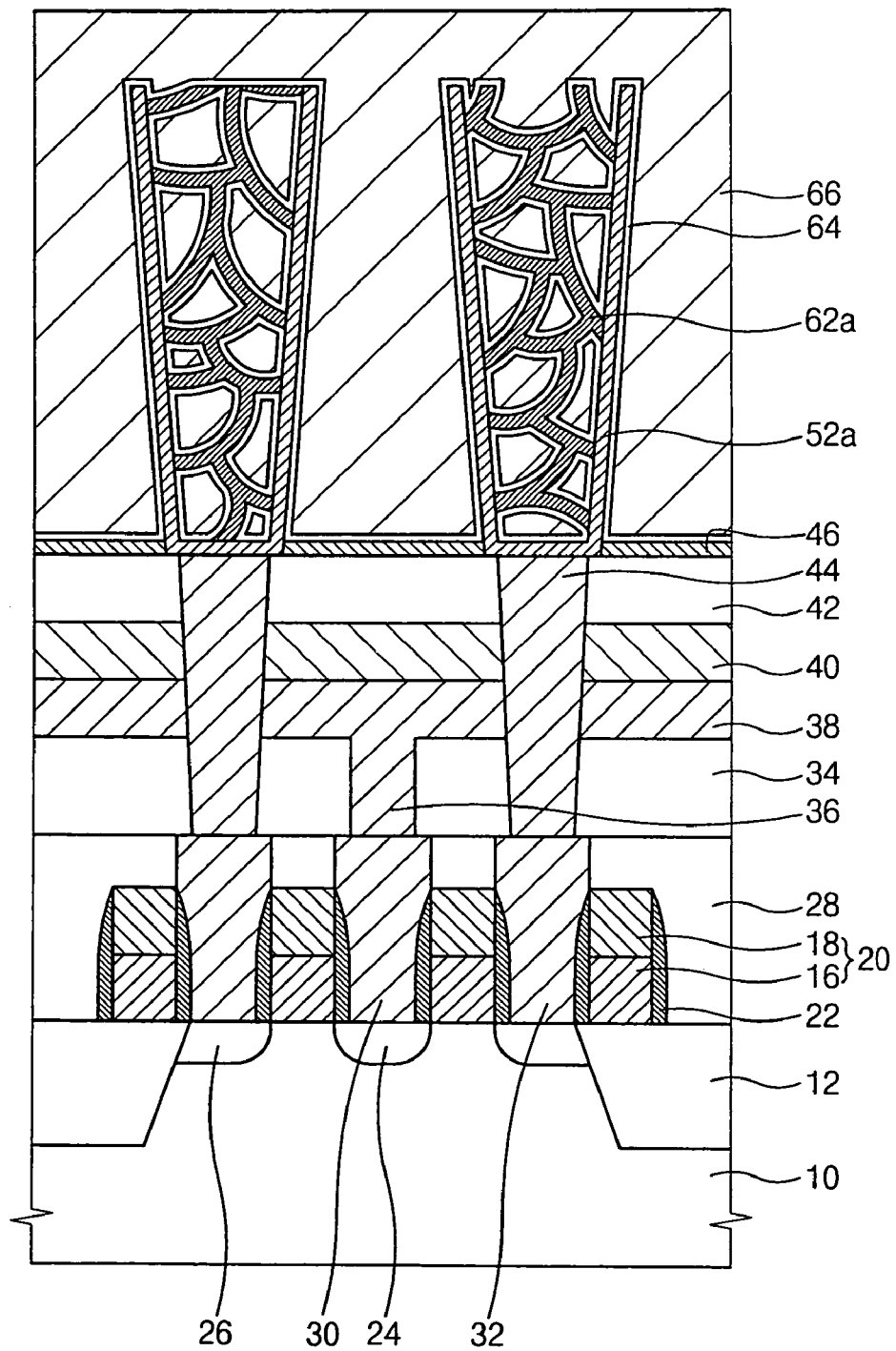

FIG. 13 is a cross-sectional view illustrating formation of the dielectric layer 64 and an upper electrode 66.

Referring to FIG. 13, a dielectric layer 64 is formed on entire surfaces of the first lower electrode 52a and the second lower electrode 62a. An effective area of a lower electrode structure includes an outside wall and a portion of an inside wall of a cylinder in the first lower electrode 52a, and a surface of the three-dimensional network structure having the fine conductive line in the second lower electrode 62a. Therefore, the effective area of the lower electrode structure may be enhanced compared with a conventional lower electrode having a cylindrical structure only.

The upper electrode 66 is formed on the dielectric layer 64 to complete a capacitor. The upper electrode 66 may be formed using a conductive material such as a metal, a conductive metal nitride or doped polysilicon. Examples of the metal may include platinum, iridium, tantalum, titanium, iron, etc. Examples of the conductive metal nitride may include platinum nitride, iridium nitride, tantalum nitride, titanium nitride, titanium aluminum nitride, iron nitride, etc. The upper electrode 66 having a single or multi-layer structure may be formed using the conductive material.

After forming the upper electrode 66, an upper insulation interlayer (not shown) and an upper wiring (not shown) are successively formed on the upper electrode 66 to complete a semiconductor device.

According to an example embodiment of the present invention, a capacitor including a first lower electrode and a second lower electrode may be manufactured. The first lower electrode has a cylindrical shape. The second lower electrode having a three-dimensional network structure of a fine conductive line is formed in the cylinder of the first lower electrode. The capacitor may have an enhanced effective area, and thus the capacitor having an enhanced capacitance may be manufactured. Therefore, a semiconductor device including the capacitor may have enhanced characteristics.

Having described the exemplary embodiments of the present invention, it is further noted that it is readily apparent to one skilled in the art that various modifications are possible without departing from the spirit and scope of this invention which is defined by the metes and bounds of the appended claims.

What is claimed is:

1. A method of manufacturing a semiconductor device comprising:
   forming a first mold layer on a substrate;
   partially etching the first mold layer to form a first mold layer pattern including an opening for a capacitor;
   forming a first lower electrode layer on a surface of the first mold layer pattern;
   forming a micelle in the opening;
   forming a preliminary second mold layer in the opening and on the first lower electrode layer to surround the micelle;
   removing the micelle to form a second mold layer having a plurality of second pores in the opening;
   forming a second lower electrode layer in the opening and on the first lower electrode layer to fill the second pores of the second mold layer, the second lower electrode layer having a plurality of first pores;
   partially removing the first lower electrode layer and the second lower electrode layer to form a first lower electrode and a second lower electrode in the opening; and
   forming a dielectric layer on the first lower electrode and the second lower electrode, and an upper electrode on the dielectric layer.

2. The method of claim 1, after forming the first lower electrode and the second lower electrode, further comprising selectively removing the first mold layer pattern and the second mold layer.

3. The method of claim 1, wherein the second pore of the second mold layer comprises a dimension of about 2 to about 100 nm.

4. The method of claim 1, wherein the preliminary second mold layer is formed using silicon oxide.

5. The method of claim 1, wherein the second mold layer is formed using transition metal oxide.

6. The method of claim 1, wherein the micelle is formed by introducing a combination of a surfactant and pure water into the opening.

7. The method of claim 6, wherein the preliminary second mold layer is formed by converting the pure water surrounding the micelle into a solid material.

8. The method of claim 6, wherein the preliminary second mold layer is formed by introducing tetraethyl orthosilicate onto the pure water and adsorbing the tetraethyl orthosilicate to the pure water.

9. The method of claim 6, wherein the surfactant comprises an amine compound, an ammonium compound or polyethylene oxide.

10. The method of claim 6, wherein a molar ratio between the surfactant and the pure water is adjusted to form the micelle having a tetragonal structure.

11. The method of claim 6, wherein a dimension of the micelle is adjusted by changing a chain length of the surfactant.

12. The method of claim 1, wherein the micelle is removed using an extraction process, a thermal combustion process or an ashing process.

13. The method of claim 1, wherein the second lower electrode is formed using a metal, a conductive metal nitride or doped polysilicon.

14. The method of claim 13, wherein the second lower electrode is formed using platinum, iridium, tantalum, titanium, iron, platinum nitride, iridium nitride, tantalum nitride, titanium nitride, titanium aluminum nitride or iron nitride.

15. A method of manufacturing a semiconductor device comprising:
   forming a first insulation interlayer including a contact on a substrate;
   forming a first mold layer pattern on the first insulation interlayer, the first mold layer pattern including an opening that exposes an upper surface of the contact;
   forming a first lower electrode layer on a surface of the first mold layer pattern;
   forming a preliminary second mold layer in the opening and on the first lower electrode layer, the preliminary second mold layer surrounding a micelle;
   removing the micelle to form a second mold layer having a plurality of first pores;
   forming a second lower electrode layer to fill up the first pore;
   partially removing the first lower electrode layer and the second lower electrode layer to form a first lower electrode and a second lower electrode in the opening;
   removing the first mold layer pattern and the second mold layer; and
   forming a dielectric layer on the first lower electrode and the second lower electrode, and an upper electrode on the dielectric layer.

16. The method of claim 15, wherein the micelle is formed by introducing a combination of a surfactant and pure water into the opening.

17. The method of claim 15, wherein the micelle is removed using an extraction process, a thermal combustion process or an ashing process.

18. The method of claim 15, wherein the second lower electrode is formed using a metal, a conductive metal nitride or doped polysilicon.

19. The method of claim 18, wherein the second lower electrode is formed using platinum, iridium, tantalum, titanium, iron, platinum nitride, iridium nitride, tantalum nitride, titanium nitride, titanium aluminum nitride or iron nitride.

* * * * *